METHOD OF FORMING GALLIUM ARSENIDE SEMICONDUCTOR DEVICES

Original Filed Sept. 26, 1960

Inventor:
Erik M. Pell,
by Marvin Snyder
His Attorney.

United States Patent Office 3,261,730

Patented July 19, 1966

3,261,730

METHOD OF FORMING GALLIUM ARSENIDE SEMICONDUCTOR DEVICES

Erik M. Pell, Scotia, N.Y., assignor to General Electric Company, a corporation of New York Original application Sept. 26, 1960, Ser. No. 58,501, now Patent No. 3,200,017, dated Aug. 10, 1965. Divided and this application Mar. 12, 1964, Ser. No. 356,684
7 Claims. (Cl. 148—186)

Figure 1:
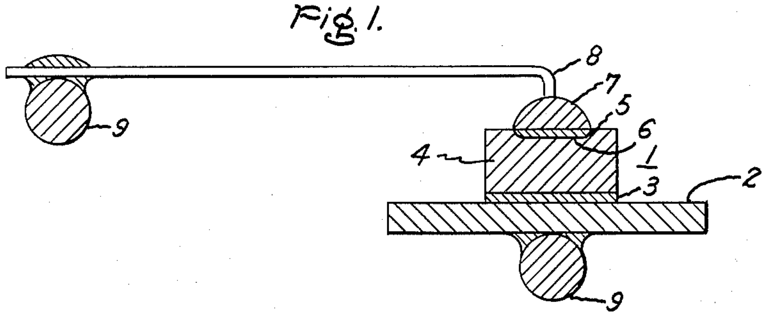

This application is a division of my application Serial No. 58,501, filed September 26, 1960, entitled "Gallium Arsenide Semiconductor Devices."

This invention relates to improved gallium arsenide tunnel diode devices.

Tunnel diode devices are now well-known in the art and are two terminal devices which comprise a space charge region less than 200 angstrom units wide such that the current-voltage characteristic thereof is determined primarily by the quantum mechanical tunneling process. The most widely known tunnel diode devices comprise a narrow P-N junction space charge region formed at the interface between a degenerate P-type conductivity semiconductive material and a degenerate N-type conductivity semiconductive material. Such tunnel diode devices exhibit a region of negative resistance in the low forward voltage range of their current-voltage characteristics. Semiconductor devices of this type and methods of making them are described and claimed in the copending applications of J. J. Tiemann, Serial No. 858,995, filed December 11, 1959, now abandoned, and T. J. Soltys, Serial No. 11,695, filed February 29, 1960, now abandoned, both assigned to the assignee of the present invention. Further general information on tunnel diode devices may be had by reference to the booklet entitled "Tunnel Diodes" published in November 1959 by Research Services, General Electric Company, Schenectady, New York.

Gallium arsenide is a well-known semiconductive material with a large band gap of 1.50 e.v. This semiconductive material, however, has not achieved the important commercial significance for use in the construction of semiconductor devices as compared to semiconductive materials such as germanium and silicon. This is due in part to the fact that it is extremely difficult to prepare gallium arsenide in large single crystals and virtually impossible to prepare in sufficient purity for use in the fabrication of most semiconductor devices. For example, the highest purity gallium arsenide achieved up to this time contains impurities in a concentration of about $10^{15}$ atoms per cubic centimeter or more. Both of these difficulties are evidenced by extremely short minority charge carrier lifetimes, a characteristic which is intolerable in most semiconductor devices.

Tunnel diode devices, as distinguished from other semiconductor devices, are virtually independent of the lifetime of minority carriers. For this reason many of the semiconductive materials which have always been plagued by short lifetimes were found to be suitable for use in the fabrication of tunnel diode devices and, at least in theory, some of these materials such as the group III–V materials might be expected to be superior in some respects for such devices.

Tunnel diodes fabricated from gallium arsenide have been shown to possess many very desirable electrical characteristics. For example, due to the large energy gap of 1.50 e.v., tunnel diodes fabricated from gallium arsenide semiconductive material are especially suited for a great variety of applications. In addition, in the above referred to application of T. J. Soltys there is described and claimed an improved gallium arsenide tunnel diode device having the very desirable characteristic of a high ratio of peak to minimum current. This characteristic provides a tunnel diode device which has the greatest of utility.

As described above commercial gallium arsenide tunnel diode devices possess many highly desirable electrical characteristics. Such devices, however, are not entirely satisfactory especially for operation at forward currents in excess of the peak current of the device. For example, when operated at a forward current 5 to 10 times the value of the peak current of the device, many commercial gallium arsenide tunnel diodes tend to show a decrease in the ratio of peak to minimum current and an eventual loss of their region of negative resistance which is normally found in the low forward voltage range of their current-voltage characteristic, such degeneration often occuring after only a few hours of such operation.

It is an object of this invention, therefore, to provide improved gallium arsenide tunnel diode devices which are not subject to the above described degeneration of electrical characteristics.

It is another object of this invention to provide a method of fabricating improved gallium arsenide tunnel diode devices of the above type.

Briefly stated, in accordance with one aspect of this invention, an improved semiconductor device comprises a body of gallium arsenide having a P-N junction space charge region less than 200 angstrom units wide. The semiconductive material on both sides of the P-N junction is rendered degenerate by having a concentration therein of excess acceptor and donor impurity respectively greater than $10^{18}$ atoms per cubic centimeter. Further, the concentration of harmful rapidly diffusing impurities, such as copper, is less than $10^{15}$ and preferably no greater than $10^{12}$ atoms per cubic centimeter.

As used throughout the specification and in the appended claims the term "rapidly diffusing impurities" refers to a substance which will diffuse into a body of gallium arsenide to a depth of 1 millimeter in a few hours or less at a temperature of about 700° C. or less as distinguished from a slow diffusing substance which diffuses to this depth at temperatures of about 1000° C. or more in 100 hours or more. "Harmful impurities" for purposes of this specification and the appended claims refers to those substances which when present in a semiconductor tunnel diode device cause an eventual disappearance of the negative resistance property thereof when operated at forward currents substantially in excess of the peak current of the device. In addition the term "impurities" is intended to cover both impurities which may be found in the semiconductive material as well as "donor" and "acceptor" impurities which are intentionally added.

Figures 2, 3:
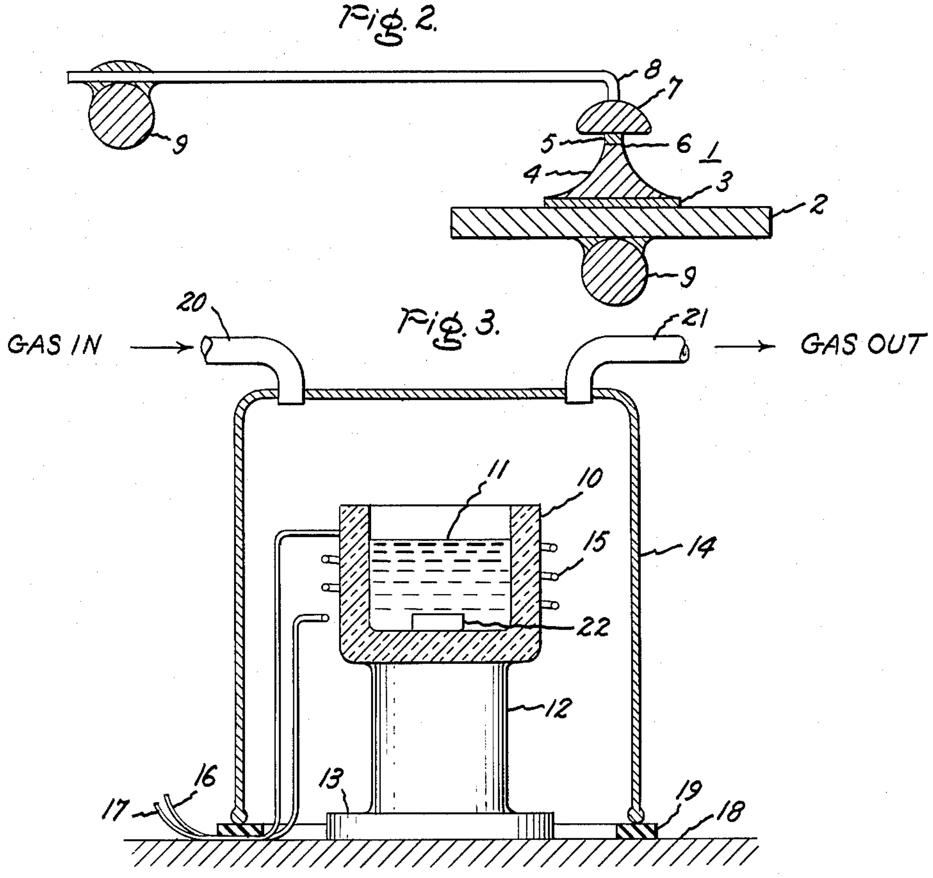

The features of my invention which I believe to be novel are set forth with particularity in the appended claims. My invention itself, however, both as to its organization and method of operation, together with further objects and advantages thereof, may best be understood by reference to the following description taken in connection with the accompanying drawing in which:

FIGS. 1 and 2 are vertical cross-sectional views of tunnel diode devices at different stages of fabrication in accordance with this invention, and FIG. 3 is a diagrammatic illustration of an apparatus suitable for the preparation of gallium arsenide for use in the construction of tunnel diode devices of this invention.

In accordance with this invention a body of gallium arsenide is heated while immersed in a material which is liquid at temperatures within the range of about 500° C. to 800° C. and capable of removing copper and other harmful rapidly diffusing impurities therefrom by the formation with such impurities of stable compounds or complexes. The formation of such compounds and complexes effectively removes these harmful rapidly diffusing impurities and results in a body of gallium arsenide in which the concentration of these impurities is less than $10^{15}$ and preferably no greater than $10^{12}$ atoms per cubic centimeter. Besides copper, silver is another example of a harmful impurity which tends to be removed by the above described treatment. It also appears that gold, although diffusing less rapidly, is likewise a harmful impurity and one which is removed to a great extent by this treatmtnt. Certain of the halides, sulfides and cyanides which are liquid within this temperature range are suitable for removing these harmful rapidly diffusing impurities, however, it is presently preferred to utilize one of the cyanides such as, for example, potassium or sodium cyanide. Although certain of the sulfides as indicated above are suitable for use herein, sulfur is a donor impurity for gallium arsenide so that sulfur introduced into the surface of the gallium arsenide body during the above described treating process must be removed before the material is further utilized in the construction of a tunnel diode device. Such removal may be accomplished by means well-known to the art for surface treating semiconductive material and may be, for example, by subjecting the body to a suitable grinding or etching treatment for both.

In FIG. 1 of the drawing there is shown a tunnel diode device constructed in accordance with this invention. A body 1 of gallium arsenide is connected in good nonrectifying contact to a base plate 2 by a suitable solder 3. Gallium arsenide body 1 has a concentration of donor or acceptor impurity therein greater than $10^{18}$ atoms per cubic centimeter, such concentration being sufficient to render the body degenerate N or P-type conductivity respectively. The concentration of harmful rapidly diffusing impurities, such as copper, in the gallium arsenide body, however, is less than $10^{15}$ and preferably no greater than $10^{12}$ atoms per cubic centimeter.

A suitable nonrectifying contact may be provided between gallium arsenide body 1 and base plate 2 in known manner by means of an alloy solder 3 which tends to induce conductivity characteristics into the gallium arsenide body of the same type initially present therein. Since there is no conductivity-type conversion produced by such an alloy solder, the resulting connection is nonrectifying. For example, when the gallium arsenide body is of P-type conductivity an acceptor alloy solder may be utilized. Alternatively, a suitable nonrectifying connection may be provided by using a solder alloy which contains neither acceptor or donor impurities. Such a solder has no effect on the initial conductivity-type of the gallium arsenide body and the resulting connection is again nonrectifying.

Base plate 2 is chosen to have a coefficient of thermal expansion approximately equal to that of gallium arsenide body 1 and may be, for example, a fernico containing by weight 54% iron, 29% nickel and 17% cobalt. Gallium arsenide body 1 has a large base region 4 and a recrystallized region 5 which exhibits opposite conductivity-type from that of base region 4. Regions 4 and 5 are separated by a P-N junction space charge region 6 less than 200 angstrom units wide. The region 5 of opposite-type conductivity may be obtained by known alloying and recrystallizing techniques. For example, a dot 7 of an impurity material capable of imparting to the one conductivity-type gallium arsenide body 1 opposite conductivity-type is placed on body 1 and heated for a time and at a temperature sufficient to cause the alloying therebetween necessary for the formation of a recrystallized degenerate region 5 having a conductivity-type opposite that of the body 1. A wire 8 may be suitably connected to alloy dot 7, as for example, during the alloying procedure and forms one electrode of the tunnel diode device, the other electrode being base plate 2. Base plate 2 and wire 8 may be connected as by soldering to header wires 9.

For optimum electrical characteristics it is desirable that the P-N junction area of the tunnel diode device be reduced as shown in detail in FIG. 2. This may be accomplished for example, either chemically or electrolytically. For further details of the fabrication of such tunnel diodes and suitable donor and acceptor materials to be utilized to provide improved tunnel diode devices of this type reference may be had to the copending applications of J. J. Tiemann and T. J. Soltys referred to hereinbefore.

In FIG. 3 there is shown a crucible 10 containing an amount of fused material 11 capable of removing copper and other harmful rapidly diffusing impurities from gallium arsenide semiconductive material. Crucible 10 is mounted and supported on a frame 12 which is in turn fixed as by a flange 13 to the bottom of a chamber 14. For purposes of illustration crucible 10 is shown heated by resistance heating element 15 which is connected to a suitable voltage source by means of leads 16 and 17. It will be understood, however, that any conventional heating means may be utilized for this purpose it being only required in this respect to raise the temperature of the crucible to a temperature sufficiently high to fuse the material 11 therein. Crucible 10 may be formed of quartz of other suitable material which will not introduce appreciable quantities of copper or other harmful impurities into the materials contained therein. The walls of chamber 14 are designed to enclose crucible 10 and may be of metal or other suitable material. The chamber 14 may be seated in a gas tight manner to the base 18 thereof by a suitable gasket 19. Chamber 14 is flushed with an inert or other non-reactive gas at atmospheric pressure introduced through conduit 20 and removed through conduit 21. Alternatively crucible 10 may be heated in an air atmosphere in which case chamber 14 may be dispensed with. Since some harmful cyanide vapor may be present during the heating treatment it is often desirable to utilize the chamber 14 as described above.

Crucible 10 is raised to a temperature sufficient to fuce the material 11 therein and a body or wafer 22 of gallium arsenide is immersed therein. Gallium arsenide body 22 may be of commercial semiconductor quality and may or may not already be impregenated with a donor or acceptor impurity to a concentration sufficient to render the material degenerate, corresponding to a donor or acceptor concentration greater than $10^{18}$ atoms per cubic centimeter. Since some of the undesirable rapidly diffusing impurities may be reintroduced into the semiconductive material during the impregnation thereof, it is presently preferred to first impregnate the gallium arsenide with a concentration of donor or acceptor impurity respectively to a concentration greater than $10^{18}$ atoms per cubic centimeter before introducing the semiconductive material into crucible 10.

The temperature of crucible 10 is raised sufficiently to melt the material 11 therein by energizing heating element 15 in known manner. For example, when the material 11 is potassium cyanide and the temperature should be raised to at least 635° C. and preferably to a temperature in the range of about 635° C. to 700° C. Crucible 10 with gallium arsenside body 22 immersed in the potassium cyanide material 11 is maintained at its elevated temperature for several hours and preferably for a period of from 5 to 30 hours for a gallium arsenide body of 1 millimeter thickness. A body having a greater thickness requires a correspondingly greater period of time. Body 22 is then removed from the fused material 11 and cooled. The treated gallium arsenide, freed of copper and other harmful rapidly diffusing impurities may then be utilized in the manner described hereinbefore in the fabrication of an improved tunnel diode device. Since such rapidly diffusing impurities have been found to contribute to the deficiencies found in prior art commercial gallium arsenide tunnel diode devices such further fabrication should be carried out under conditions such that no appreciable quantity of copper or other harmful rapidly diffusing impurities are reintroduced into the tunnel diode devices. Alternatively, a tunnel diode device may be fabricated from commercial semiconductor quality gallium arsenide in the usual manner and then by suitable treatment as described hereinbefore the harmful rapidly diffusing impurities may be removed such that the concentration of harmful rapidly diffusing impurities in the gallium arsenide is less than $10^{15}$ and preferably no greater than $10^{12}$ atoms per cubic centimeter. It will be understood, however, that in such cases the donor alloy utilized should have a melting point above the temperature used in the treatment.

In one specific example, the method of this invention is carried out using an apparatus of the type illustrated in FIG. 3. Two grams of potassium cyanide are placed in a ⅝" inside diameter crucible 10. A body of commercial semiconductor quality gallium arsenide is rendered degenerate P-type by impregnation with an acceptor impurity of cadmium to a concentration greater than $10^{18}$ atoms per cubic centimeter. A wafer 22 having a length and width of 3 millimeters and a thickness of 0.5 millimeter is cut from the body of degenerate P-type gallium arsenide and added to crucible 10. An additional two grams of potassium cyanide are placed in crucible 10 to provide a quantity of potassium cyanide sufficient to cause the wafer 22 to be immersed therein. Heating element 15 is energized to raise the temperature of crucible 10 to about 650° C. fusing the potassium cyanide placed therein. Crucible 10 is maintained at a temperature of about 650° C. for approximately 30 hours after which wafer 22 is removed therefrom and cooled.

A fernico base plate having the approximate dimensions of 0.050" x 0.050" x 0.050" is soldered to a ⅛" diameter gold header utilizing an indium-cadmium solder in conventional manner. The gallium arsenide wafer 22 freed of copper and other harmful rapidly diffusing impurities by the above described treatment such that the concentration thereof in the wafer is less than than $10^{15}$ atoms per cubic centimeter is secured to the fernico base plate with a solder having 4 weight percent cadmium, the remainder being indium, by placing the solder under the gallium arsenide and heating the assembly in a hydrogen atmosphere at 450° C. for 20 seconds. A small dot of a donor activator alloy containing tin as the major constituent the remainder being sulfur is placed upon the upper surface of the gallium arsenide wafer. The assembly is inserted into a reaction furnace which is flushed with hydrogen at atmospheric pressure. The wafer is heated to a temperature of 500° C. for 45 seconds to cause the formation of a recrystallized N-type region of degenerate gallium arsenide separated from the P-type region of the gallium arsenide wafer by a narrow P-N junction. The assembly is removed and etched in white etch for four seconds.

Tunnel diode devices constructed in accordance with this invention are found capable of sustained operation at forward currents greatly in excess of their peak values without exhibiting any significant change in electrical characteristics. For example, whereas many commercial gallium arsenside tunnel diode devices operated at forward currents of about 10 times their peak show a deterioration of the negative resistance region in only a few hours, tunnel diode devices constructed in accordance with this invention have been tested for from 100 to 200 hours at such excessive forward currents without exhibiting any significant change in their electrical characteristics.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent by the United States is:

1. The method of making semiconductor bodies for use in tunnel diode devices which comprises: providing a gallium arsenide body having a concentration of an impurity selected from the group consisting of donors and acceptors greater than $10^{18}$ atoms per cubic centimeter such that said body is degenerate and of one-type conductivity, said group excluding copper, silver and gold; immersing said body in a material fusing at a temperature below about 800° C. and capable of forming stable compounds and complexes with harmful rapidly diffusing impurities of the class consisting of copper, silver and gold in said body, said material being selected from the group consisting of cyanides, halides and sulfides; and heating said material to a temperature above the fusing temperature thereof for at least 5 hours to reduce the concentration of said harmful rapidly diffusing impurities in said body to a value less than about $10^{15}$ atoms per cubic centimeter.

2. The method of making semiconductor bodies for use in tunnel diode devices which comprises: providing a gallium arsenide body; impregnating said body with an impurity selected from the group consisting of donors and acceptors to a concentration greater than $10^{18}$ atoms per cubic centimeter to render said body degenerate and of one-type conductivity, said group excluding copper, silver and gold; and heating said body while immersed in potassium cyanide at a temperature in the range of about 635° C. to 700° C. for at least 5 hours to remove harmful rapidly diffusing impurities of the class consisting of copper, silver and gold from said body.

3. The method of making semiconductor bodies for use in tunnel diode devices which comprises: providing a gallium arsenide body having a concentration of an impurity selected from the group consisting of donors and acceptors greater than $10^{18}$ atoms per cubic centimeter such that said body is degenerate and of one-type conductivity, said group excluding copper, silver and gold; immersing said body in fused potassium cyanide; and maintaining said body in said potassium cyanide at a temperature in the range of about 635° C. to 700° C. for at least 5 hours to cause the concentration of harmful rapidly diffusing impurities of the class consisting of copper, silver and gold in said body to be lowered to a value no greater than $10^{12}$ atoms per cubic centimeter.

4. The method of making semiconductor bodies for use in tunnel diode devices which comprises: providing a gallium arsenide body having a concentration of an impurity selected from the group consisting of donors and acceptors greater than $10^{18}$ atoms per cubic centimeter such that said body is degenerate and of one-type conductivity, said group excluding copper, silver and gold; immersing said body in fused potassium cyanide; and maintaining said body in said potassium cyanide at a temperature of about 650° C. for a period of from about 5 to 30 hours to lower the concentration of harmful rapidly diffusing impurities of the class consisting of copper, silver and gold in said body.

5. The method of making semiconductor bodies for use in tunnel diode devices which comprises: providing a gallium arsenide body having a concentration of an impurity selected from the group consisting of donors and acceptors greater than $10^{18}$ atoms per cubic centimeter such that said body is degenerate and of one-type conductivity, said group excluding copper, silver and gold; providing a material which fuses at a temperature within the range of about 500° C. to 800° C. and selected from the group consisting of cyanides, halides and sulfides; placing said body in said material; fusing said material; and maintaining said body in said fused material for at least 5 hours to reduce the concentration of harmful rapidly diffusing impurities of the class consisting of copper, silver and gold in said body to a value no greater than $10^{12}$ atoms per cubic centimeter.

6. The method of making semiconductor tunnel diode devices which comprises: providing a gallium arsenide body; impregnating said body with an impurity selected from the group consisting of donors and acceptors therefor to a concentration sufficient to render said body degenerate and of one-type conductivity, said group excluding copper, silver and gold; heating said body in a fused material fusing at a temperature below about 800° C. and capable of forming stable compounds and complexes with harmful rapidly diffusing impurities of the class consisting of copper, silver and gold in said gallium arsenide body to cause the concentration of said harmful rapidly diffusing impurities in said body to be reduced to a concentration less than about $10^{15}$ atoms per cubic centimeter, said fused material being selected from the group consisting of cyanides, halides and sulfides; removing said body from said fused material; and alloying an impurity material capable of rendering said body degenerate and of opposite-type conductivity to a portion of a surface of said body to establish therein a P-N junction.

7. The method of making semiconductor tunnel diode devices which comprises: providing a gallium arsenide body; impregnating said body with an impurity selected from the group consisting of donors and acceptors therefor to a concentration sufficient to render said body degenerate and of one-type conductivity, said group excluding copper, silver and gold; heating said body while immersed in fused potassium cyanide to a temperature in the range of about 635° C. to 700° C. for at least 5 hours to reduce the concentration of harmful rapidly diffusing impurities of the class consisting of copper, silver and gold in said body to a concentration less than about $10^{15}$ atoms per cubic centimeter; removing said body from said fused potassium cyanide and thereafter alloying a dot of impurity material capable of rendering said body degenerate and of opposite-type conductivity to a surface of said body to establish a P-N junction region in said body.

References Cited by the Examiner

UNITED STATES PATENTS

| | | | |
|---|---|---|---|
| 3,007,816 | 11/1961 | McNamara | 252—62.3 X |
| 3,007,819 | 11/1961 | McNamara | 148—191 |
| 3,012,175 | 12/1961 | Jones et al. | 148—33.1 |

OTHER REFERENCES

Fuller et al.: J. Phys. Chem. Solids, Pergamon Press, 1958, volume 6, pages 173–177.

Holonyak et al.: Proceedings of the I.R.E., 8/60, pages 1405–1409.

HYLAND BIZOT, *Primary Examiner.*

BENJAMIN HENKIN, *Examiner.*

H. W. CUMMINGS, *Assistant Examiner.*